United States Patent
Van Zyl et al.

(10) Patent No.: US 9,536,713 B2
(45) Date of Patent: Jan. 3, 2017

(54) RELIABLE PLASMA IGNITION AND REIGNITION

(71) Applicant: Advanced Energy Industries, Inc., Fort Collins, CO (US)

(72) Inventors: Gideon Van Zyl, Fort Collins, CO (US); David W. Madsen, Fort Collins, CO (US); Fernando Gustavo Tomasel, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 338 days.

(21) Appl. No.: 14/188,102

(22) Filed: Feb. 24, 2014

(65) Prior Publication Data

US 2014/0239813 A1  Aug. 28, 2014

Related U.S. Application Data

(60) Provisional application No. 61/770,119, filed on Feb. 27, 2013.

(51) Int. Cl.
*H01J 37/32* (2006.01)

(52) U.S. Cl.
CPC ...... *H01J 37/3299* (2013.01); *H01J 37/32935* (2013.01)

(58) Field of Classification Search
None
See application file for complete search history.

(56) References Cited

U.S. PATENT DOCUMENTS

| | | | | |
|---|---|---|---|---|
| 5,965,034 | A * | 10/1999 | Vinogradov | H01J 37/321 118/723 I |
| 6,703,080 | B2 * | 3/2004 | Reyzelman | H01J 37/32082 118/723 E |
| 8,421,377 | B2 * | 4/2013 | Kirchmeier | H01J 37/32045 315/291 |
| 2003/0058663 | A1 * | 3/2003 | Bennett | H01J 37/32082 363/40 |
| 2003/0215373 | A1 * | 11/2003 | Reyzelman | H01J 37/32082 422/186.29 |
| 2006/0241879 | A1 * | 10/2006 | van Zyl | H01J 37/32082 702/60 |
| 2009/0278512 | A1 * | 11/2009 | Karlicek | H01J 37/32174 323/208 |
| 2010/0168932 | A1 * | 7/2010 | Van Zyl | H02P 9/04 700/295 |

(Continued)

OTHER PUBLICATIONS

Moon, Kihwan, "Internaitonal Preliminary Report on Patentability re Application No. PCT/US2014/018398", Sep. 11, 2015, p. 8, Published in: CH.

(Continued)

*Primary Examiner* — Douglas W Owens
*Assistant Examiner* — Srinivas Sathiraju
(74) *Attorney, Agent, or Firm* — Neugeboren O'Dowd PC

(57) ABSTRACT

This disclosure describes systems, methods, and apparatus for ensuring desirable ignition of plasma in a plasma processing chamber via providing increased instantaneous power during an ignition period for both continuous wave (CW) and pulsed power delivery. The systems, methods, and apparatus can be applied to both initial ignition of a plasma and reignition of a plasma where pulsed power delivery leads to periodic extinction of the plasma.

20 Claims, 12 Drawing Sheets

(56) References Cited

U.S. PATENT DOCUMENTS

| | | | | |
|---|---|---|---|---|
| 2010/0171427 | A1* | 7/2010 | Kirchmeier | H01J 37/32045 315/111.21 |
| 2010/0174420 | A1* | 7/2010 | Van Zyl | H01J 37/32009 700/297 |
| 2010/0283395 | A1* | 11/2010 | Van Zyl | H01J 37/32082 315/160 |
| 2011/0148303 | A1* | 6/2011 | Van Zyl | H03F 1/56 315/111.21 |
| 2012/0218042 | A1* | 8/2012 | Mueller | H02P 9/105 330/278 |
| 2012/0280618 | A1* | 11/2012 | Utano | H01J 37/32009 315/111.41 |
| 2013/0002136 | A1* | 1/2013 | Blackburn | H01J 37/32183 315/111.21 |

OTHER PUBLICATIONS

Engelbrecht, et al., "A Wide-Band Low Noise L-Band Balanced Transistor Amplifier", Nov. 6, 1964, p. 12, Publisher: Bell Telephone Laboratories, Inc., Published in: US.

Kurokawa, K., "Design Theory of Balanced Transistor Amplifiers", May 7, 1965, p. 24, Publisher: The Bell System Technical Journal, Published in: US.

Mitrovic, Bayer, "International Search Report and Written Opinion re PCT/US2014/018398", Jun. 6, 2014, p. 14, Published in: AU.

\* cited by examiner

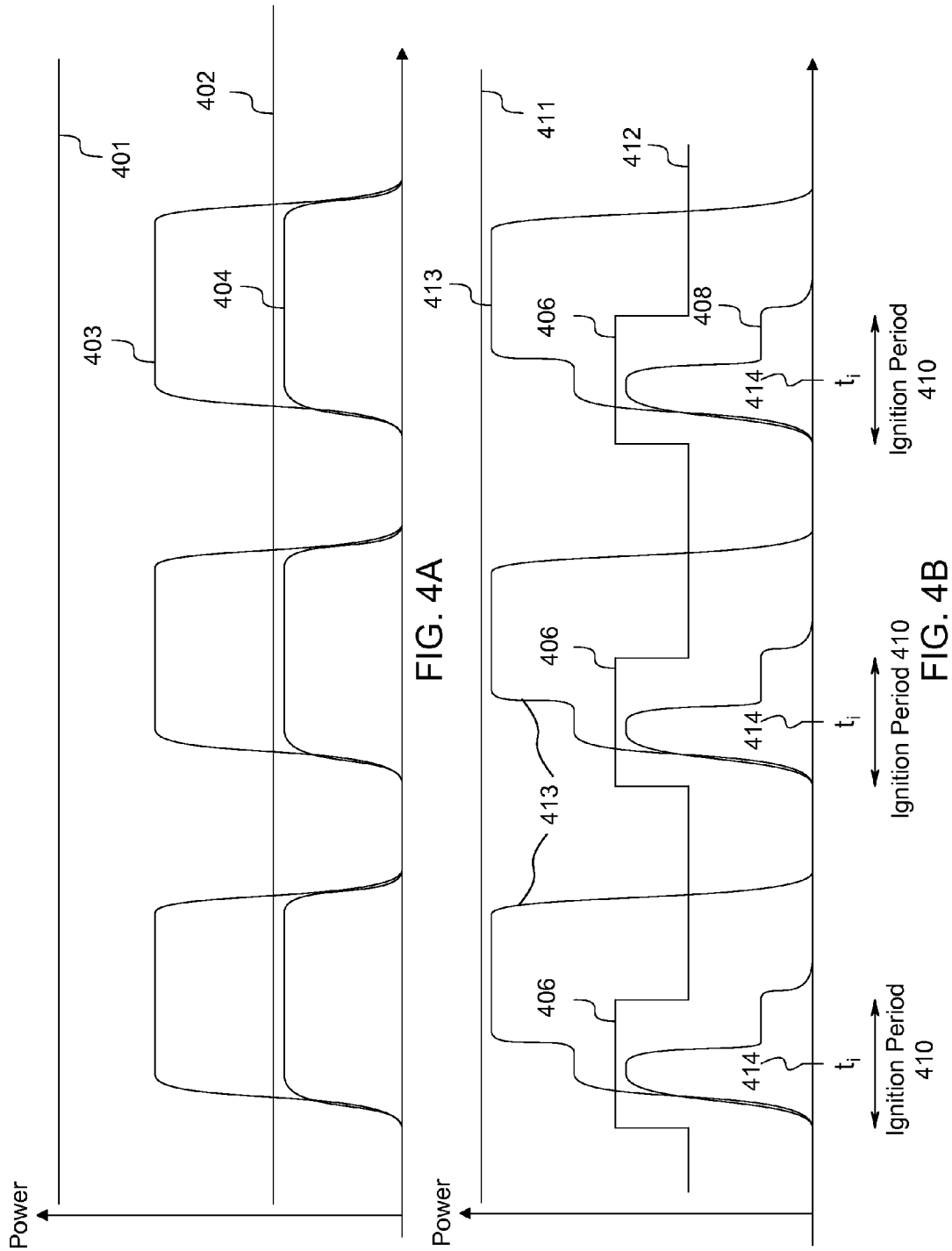

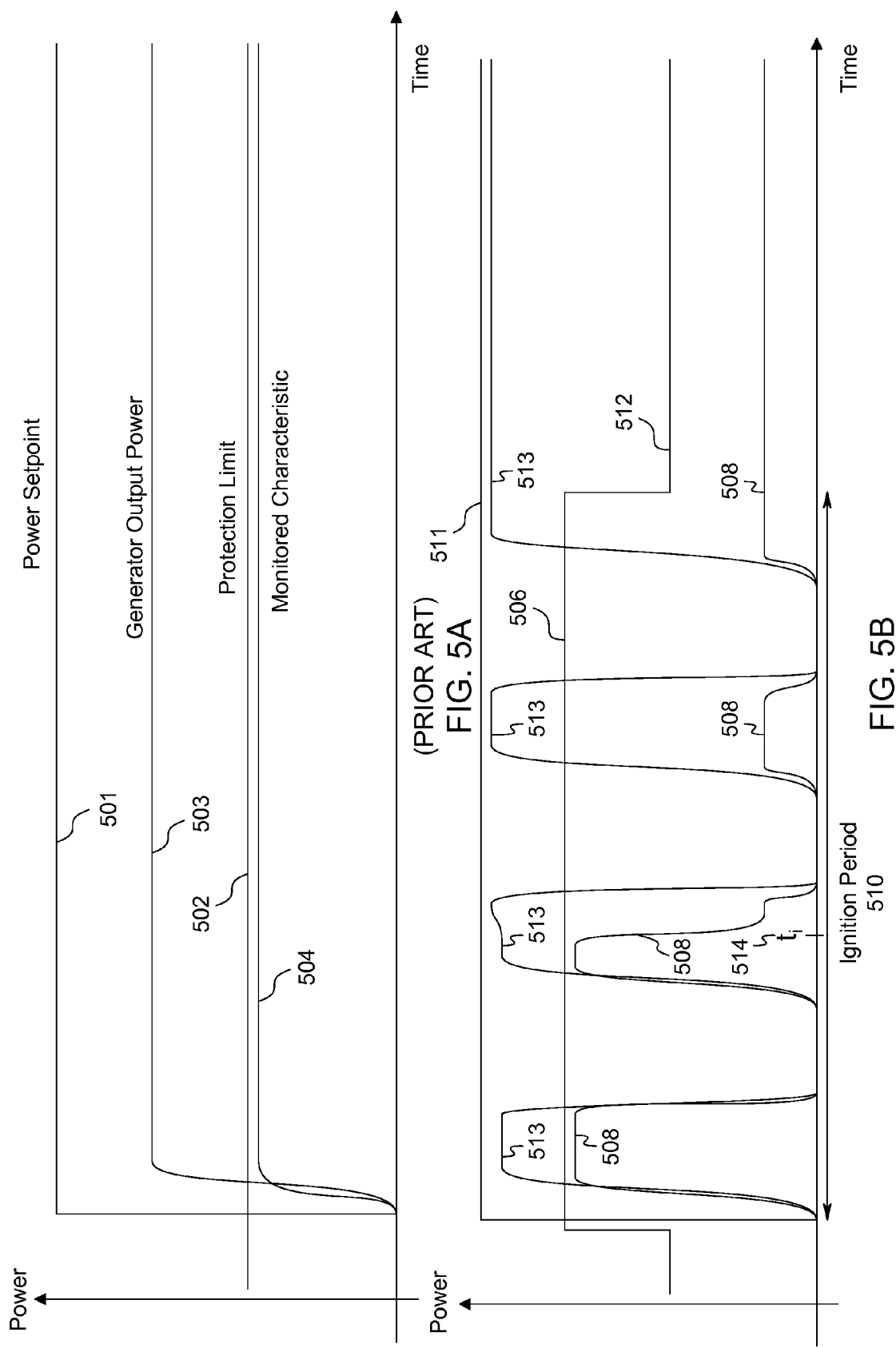

RELIABLE PLASMA IGNITION AND REIGNITION

RELATED APPLICATIONS

The present application claims the benefit of U.S. Patent Application Ser. No. 61/770,119, entitled, "RELIABLE PLASMA IGNITION AND REIGNITION" and filed on Feb. 27, 2013. The details of this application are incorporated herein by reference in their entirety.

FIELD OF THE DISCLOSURE

The present disclosure relates generally to plasma processing. In particular, but not by way of limitation, the present disclosure relates to systems, methods and apparatuses for providing more reliable power during plasma ignition and reignition.

BACKGROUND

Balanced amplifiers, as described for instance by K. Kurokawa, "Design theory of balanced transistor amplifiers", Bell System Technical Journal, October 1965, are often used in power supply systems for plasma processing chambers. Unlike traditional single amplifiers, balanced amplifiers provide more desirable pulse shapes when using pulsed power to sustain a plasma. Balanced amplifiers also provide better plasma stability and further produce forward power independent of load impedance. In other words, for a given control input to the power amplifier, forward power does not change as a result of load impedance changes (e.g., due to changes in the plasma density or other plasma characteristics).

Yet, balanced amplifiers also create and amplify problems associated with traditional single amplifiers. For instance, when there is a load mismatch (e.g., during ignition or reignition of the plasma where impedance changes drastically), power dissipation becomes unevenly distributed between the two amplifiers making up the balanced amplifier, which can damage the one dissipating more power. The traditional solution to this problem is to reduce the balanced amplifier's power profile (e.g., reduce load power at high load reflection coefficient magnitude) such that the amplifier dissipating more power is not damaged. In plasma ignition applications this is a major drawback since plasma ignition normally requires an amplifier delivering substantial power into a non-matched load.

There is therefore a need in the art for systems and methods of operating balanced amplifiers that provide levels of delivered power to the plasma that approach levels achievable with a traditional single amplifier during plasma ignition and reignition.

SUMMARY

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

Some embodiments of the disclosure may be characterized as a method of providing power to a plasma processing chamber. The method can include providing power from a balanced amplifier to a plasma processing chamber. The method can further include monitoring a first characteristic of the plasma processing system. The method can further include comparing the first characteristic to a variable protection limit. The method can yet further include reducing the power if the first monitored characteristic exceeds the variable protection limit. The method can further include raising the variable protection limit at a start of power delivery to the plasma. Lastly, the method can include reducing the variable protection limit.

Other embodiments of the disclosure may also be characterized as a power supply for providing power to a plasma processing chamber. The power supply can include a power conditioning component, a balanced amplifier, an output sensor, and a measurement and control system. The measurement and control system can include a comparison module and a power output control module. The power conditioning component can receive input power to the power supply. The balanced amplifier can be coupled to the power conditioning component and can provide an output power to an output of the power supply. The output sensor can take measurements of a first characteristic of the output power. The measurement and control system can be in communication with the output sensor. The comparison module can compare the measurements of the first characteristic of the output power to a variable protection limit, where the variable protection limit is temporarily raised during a plasma ignition period. The power output control module can reduce the output power if the first monitored characteristic exceeds the variable protection limit.

Other embodiments of the disclosure can be characterized as a non-transitory, tangible computer readable storage medium, encoded with processor readable instructions to perform a method for providing power to a plasma processing chamber via a plasma processing system. The method can include providing power from a balanced amplifier to a plasma processing chamber. The method can further include monitoring a first characteristic of the plasma processing system. The method can further include comparing the first characteristic to a variable protection limit. The method can yet further include reducing the power if the first monitored characteristic exceeds the variable protection limit. The method can yet further include raising the variable protection limit at a start of power delivery to the plasma. The method can also include reducing the variable protection limit after some time period.

BRIEF DESCRIPTION OF THE DRAWINGS

Various objects and advantages and a more complete understanding of the present invention are apparent and more readily appreciated by referring to the following detailed description and to the appended claims when taken in conjunction with the accompanying drawings:

FIG. 4A illustrates a power versus time plot for a pulsed power delivery scheme having a traditional fixed protection limit;

FIG. 4B illustrates a power versus time plot for a pulsed power delivery scheme having temporarily-increased protection limit during one or more ignition periods;

FIG. 5A illustrates a power versus time plot for a continuous wave (CW) power delivery scheme having a traditional fixed protection limit;

FIG. 5B illustrates a power versus time plot for a CW power delivery scheme having one or more temporarily-increased protection limits, along with a high frequency pulsing of the power, during an ignition period.

DETAILED DESCRIPTION

The word "exemplary" is used herein to mean "serving as an example, instance, or illustration." Any embodiment described herein as "exemplary" is not necessarily to be construed as preferred or advantageous over other embodiments.

For the purposes of this disclosure, "ignition" includes ignition of a plasma and reignition during pulsed operation where the plasma is 'extinguished' between power pulses or during pulse transitions.

For the purposes of this disclosure, "protection limits" means any parameters used to protect an amplifier from seeing power levels that could damage the amplifier. A reflected power limit and a transistor junction temperature limit are two examples of protection limits.

For the purposes of this disclosure, an "ignition period" is a period of time starting when power to a plasma chamber begins to ramp up and ending a short time after a plasma has ignited or reignited in the chamber.

Systems, methods, and apparatus are herein disclosed for temporarily raising a power profile of balanced amplifiers at a start of a power pulse in order to achieve more desirable plasma ignition. This can be achieved via use of temporarily higher protection limits that enable higher power to be delivered by the balanced amplifier during ignition or reignition than is allowable during steady state power delivery. A second way to achieve this is by pulsing the power during an ignition period along with a temporary increase in the protection limit, and in this way an average power during the ignition period is less dangerous to the amplifier.

The Balanced Amplifier

Figure 7:
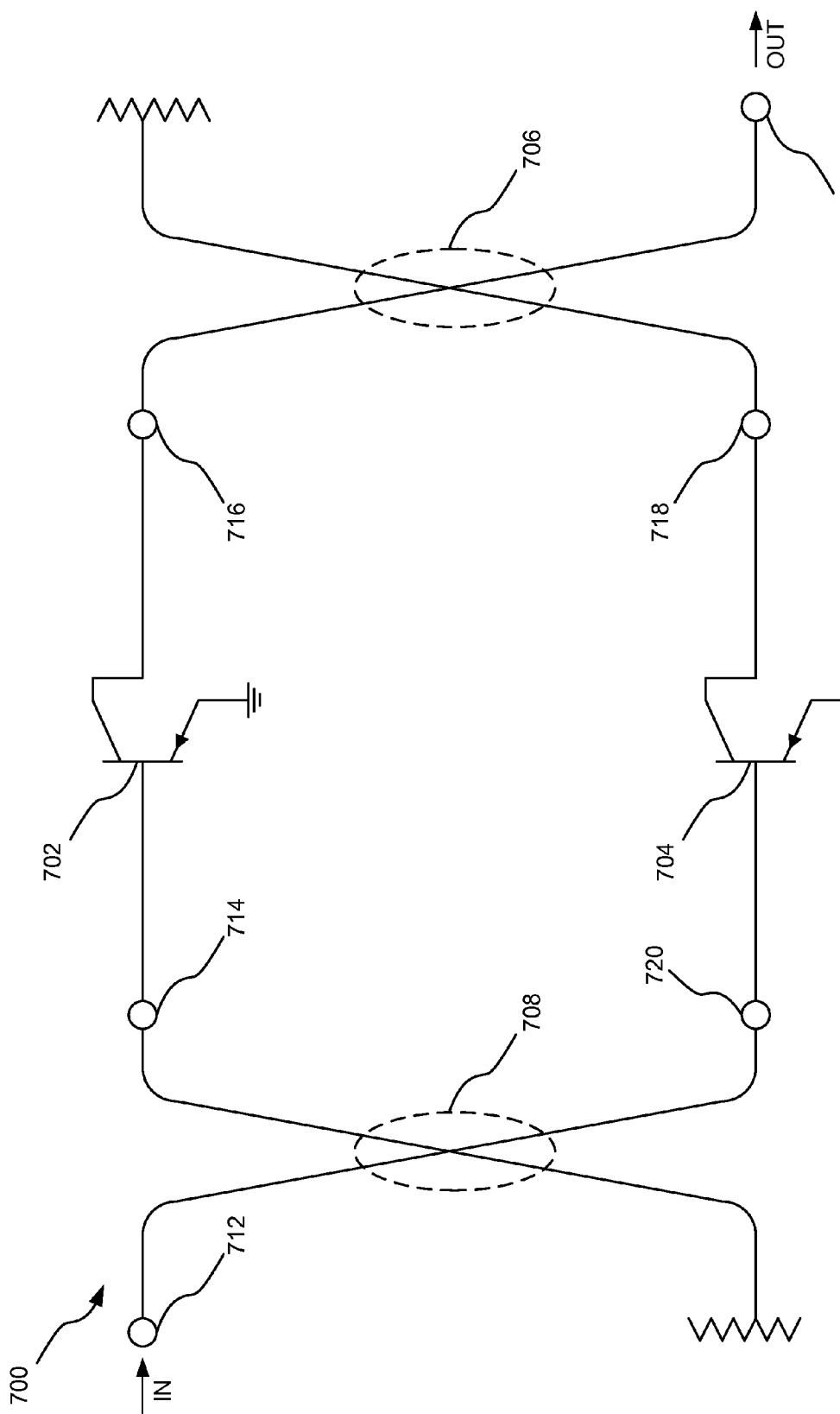
FIG. 7 shows an embodiment of a circuit diagram for a balanced amplifier.

FIG. 7 shows an embodiment of a circuit diagram for a balanced amplifier. Each stage of the balanced amplifier can include a pair of amplifiers 702 and 704 (illustrated as transistors, but other types of amplifiers including multiple active and passive components are also envisioned) having inputs that are connected to two ports forming a conjugate pair of a first directional coupler 708 (e.g., 3-dB) and whose outputs are similarly connected to conjugate ports of a second directional coupler 706. The fourth port of each directional coupler is terminated in a suitable termination, typically a 50 ohm resistor. As is well known, couplers of excellent electrical characteristics are obtained by means of a coupled pair of parallel transmission lines of properly chosen geometry. A signal entering the input port 712 will be split into two signals of nearly equal amplitude and 90° relative phase offset from each other emerging from ports 714 and 720 at some attenuated power (e.g., each being −3 dB) relative to the input signal.

Assuming for the moment that the amplifiers 702 and 704 are identical, the two signals from ports 714 and 720 will be amplified and recombined in the output coupler 706 where they emerge as a single output signal from port 710. The insertion gain between ports 712 and 710 is that of either amplifier 702, 704. The input and output impedance matches at ports 712 and 710, respectively, depend only on the input and output coupler 708 and 706 characteristics and the coupler terminations. In principle, the couplers 708, 710 can be constructed so that these impedance matches are frequency independent over a suitable frequency range.

The balanced amplifier 700 may diverge from the operation described above for various reasons such as non-ideal couplers 708, 706, non-ideal coupler terminations and imbalances between the amplifiers 702, 704 to name a few examples. Experimentation shows that 3-dB couplers exhibit nearly ideal characteristics over a relative bandwidth of 30%.

Increased Protection Limits

Figure 1:
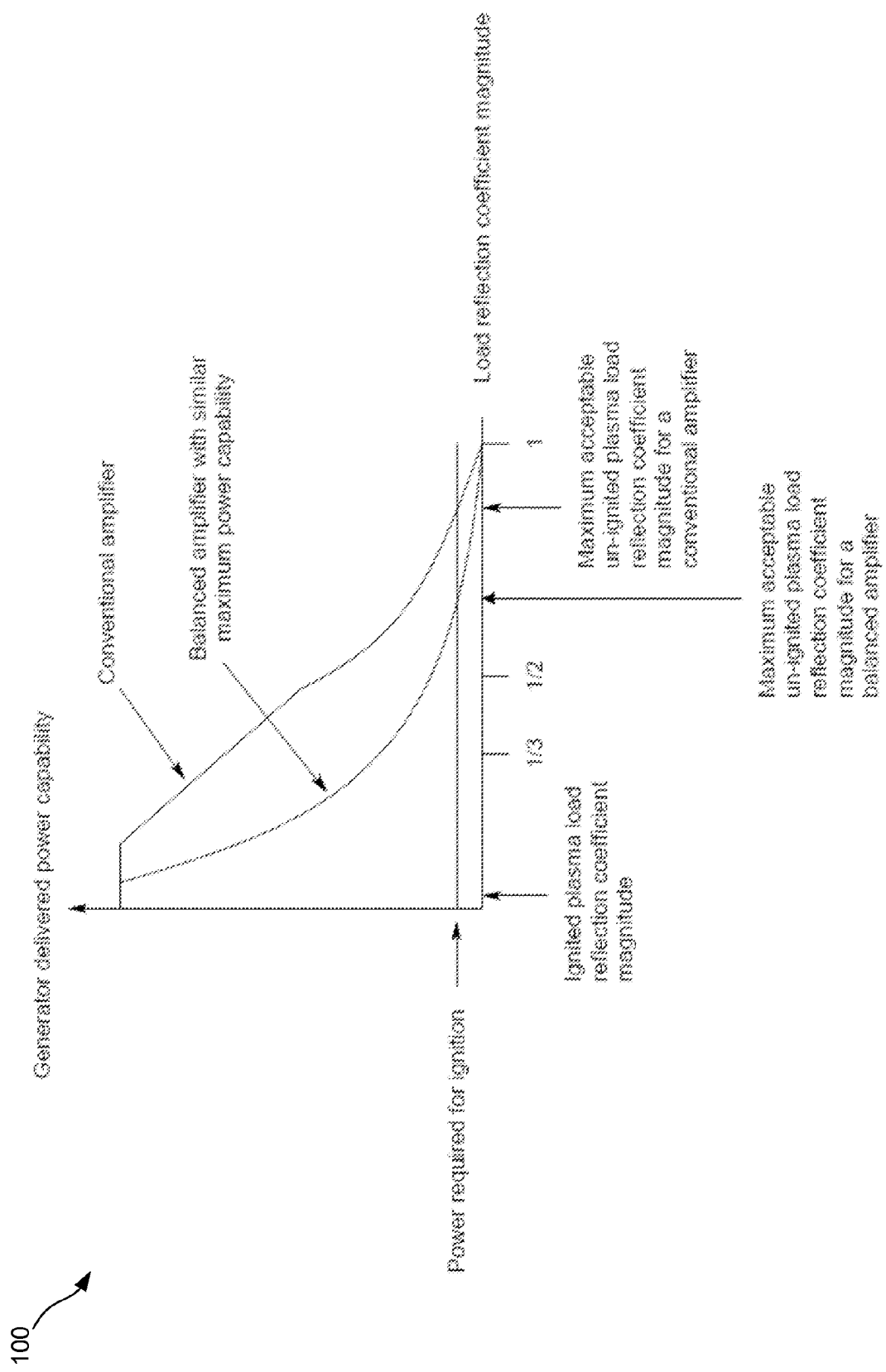
FIG. 1 illustrates a power profile for a balanced amplifier and a power profile for a traditional single amplifier.

Typical protection limits for balanced amplifiers result in a power profile that is reduced as compared to traditional single amplifiers, as seen in FIG. 1. As seen, the maximum acceptable load reflection coefficient magnitude for an unignited plasma is significantly lower for a balanced amplifier than for a single amplifier. Thus, when using a balanced amplifier, plasma processing system designers must achieve lower plasma load impedance reflection coefficients.

However, these power limits are based on the balanced amplifier's ability to withstand high powers for long periods of time, periods that can be considered "steady-state." For short durations, such as during a plasma ignition period, the balanced amplifiers can withstand higher power than typical protection limits allow for.

Figure 2:
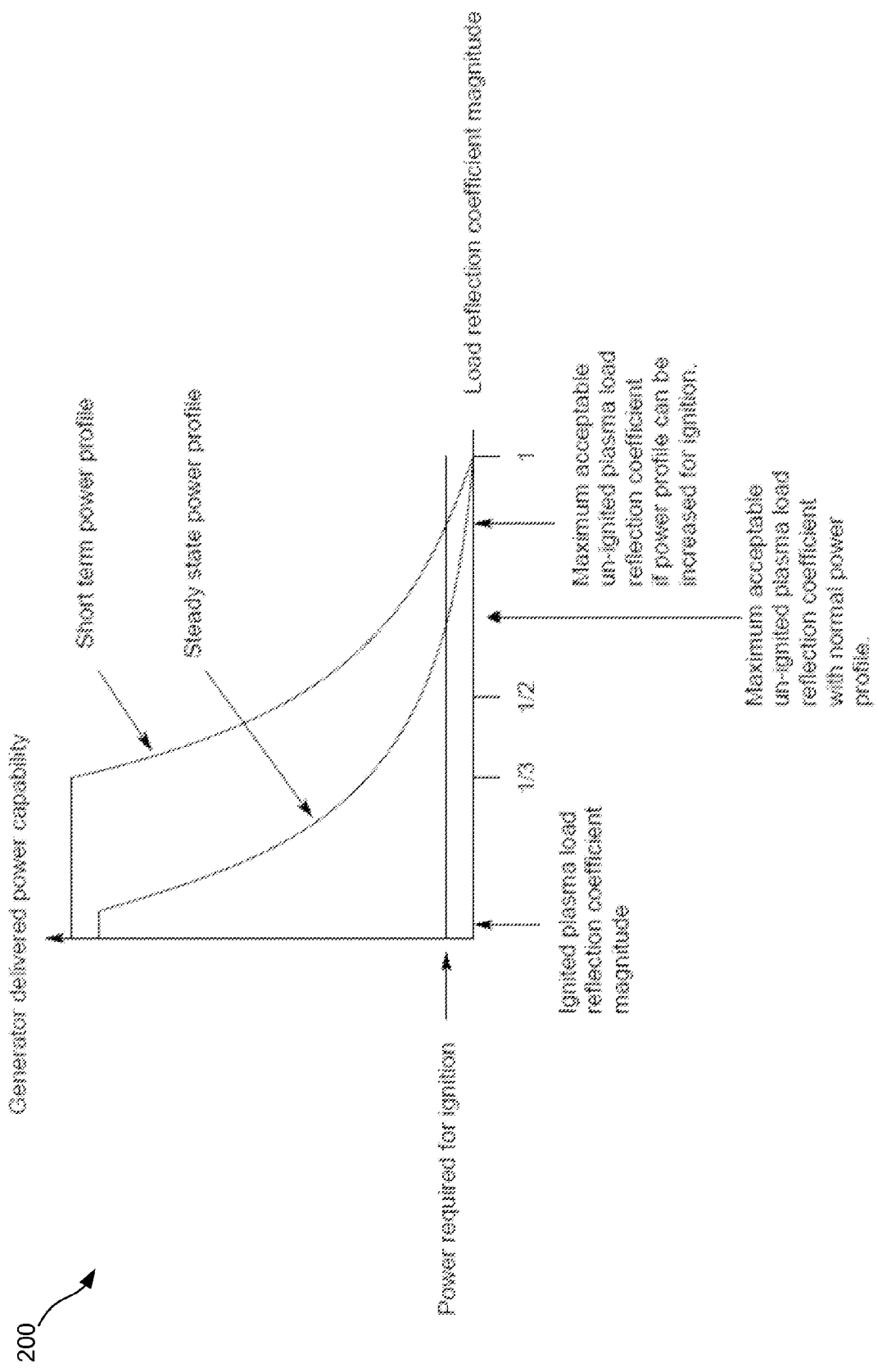
FIG. 2 illustrates a traditional fixed power profile and a temporarily-raised power profile according to one embodiment of this disclosure.

FIG. 2 illustrates a traditional steady-state power profile and a short-term power profile, both for a balanced amplifier, according to one embodiment of this disclosure. During the ignition period, one or more protection limits are raised above those protection limits seen during steady-state operation. These temporarily raised protection limits can be referred to as ignition-period protection limits. FIG. 2 shows that during an ignition period using a balanced amplifier, greater power can be applied than under traditional fixed protection limits, thus helping to ensure that sufficient power is delivered to ignite the plasma when a load mismatch exists (i.e., at loads approaching 1 in FIG. 2).

At an end of the ignition period, the one or more protection limits can be returned to their steady-state values. The transition from ignition-period protection limits to steady-state protection limits can be an instantaneous or substantially instantaneous transition or can be a gradual transition.

Figure 3A:
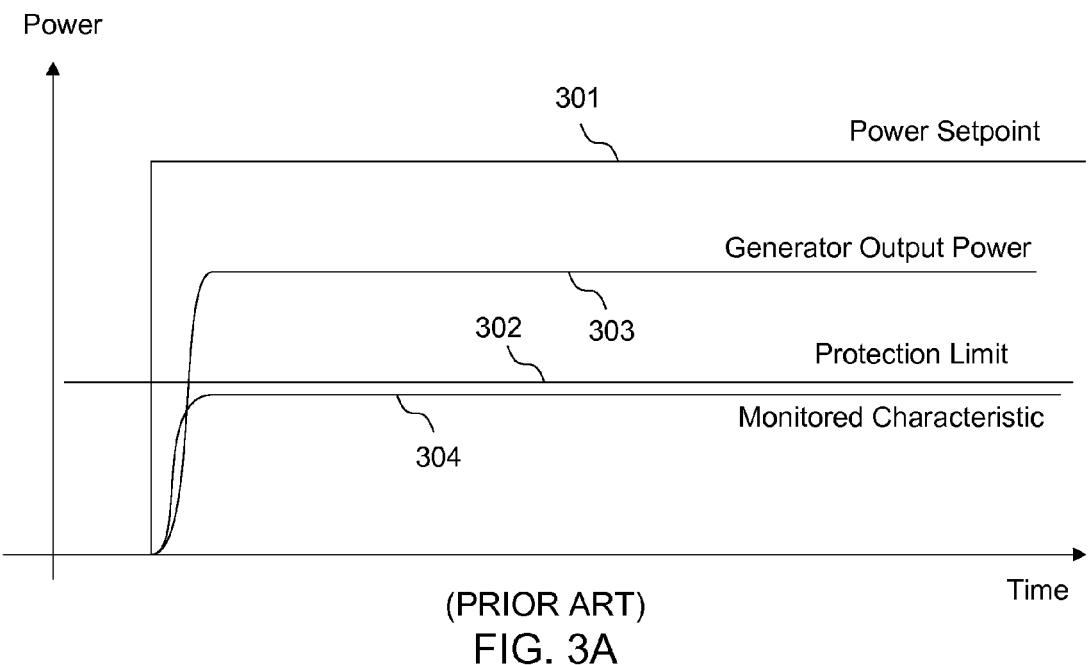
FIG. 3A illustrates a power versus time plot for a continuous wave (CW) power delivery scheme having a traditional fixed protection limit.

FIG. 3A illustrates a power versus time plot for a continuous wave (CW) power delivery scheme having a fixed protection limit 302 that is compared to a monitored characteristic of the plasma processing system. A reflected power limit is one example of the fixed protection limit 302, and it can be seen that the monitored characteristic 304 remains at or just below the protection limit 302. Assuming reflected power is the monitored characteristic, if the plasma is not ignited, as is the case in FIG. 3A, the reflected power remains high and the generator output power 303 may never reach the desired power setpoint 301.

Figure 3B:
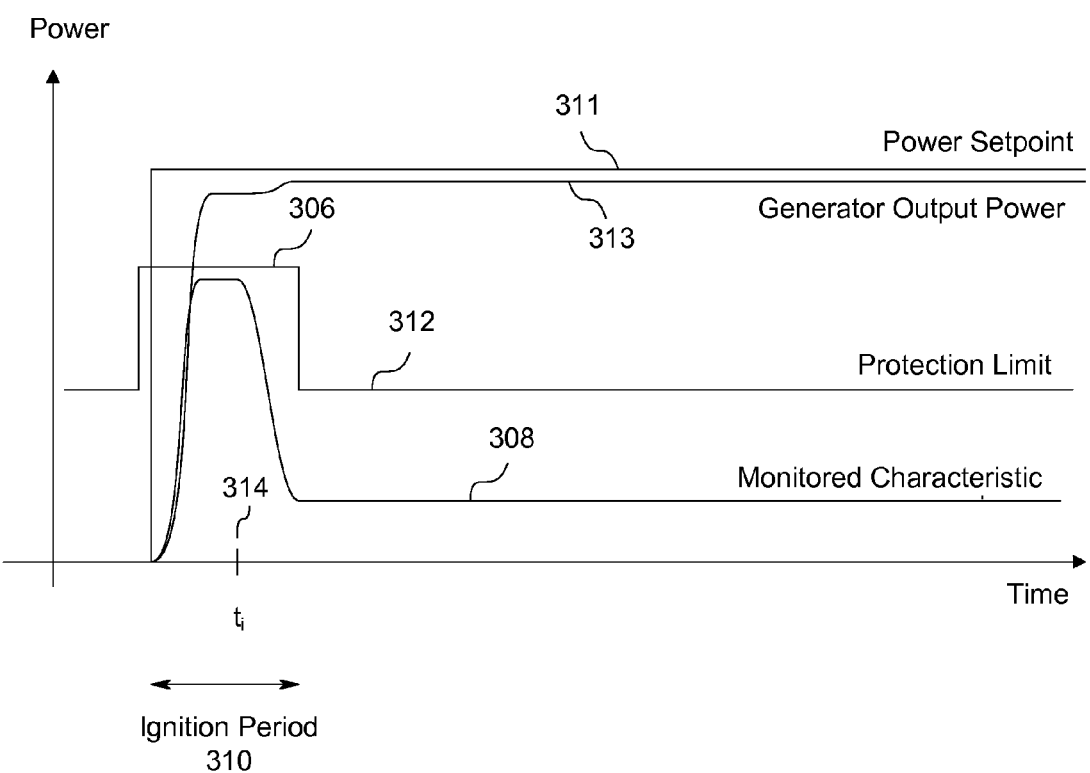
FIG. 3B illustrates a power versus time plot for a CW power delivery scheme having a temporarily-increased protection limit during an ignition period.

FIG. 3B illustrates a power versus time plot for a CW power delivery scheme having a temporarily-increased protection limit 306 during an ignition period 310. At an end of the ignition period 310, the protection limit can return to a steady-state protection limit 312. As a result of the temporarily-increased protection limit 306, enough power can be applied to the plasma and ignition is achieved at time 314, whereas ignition did not occur in the prior art example of 3A. In the case where the monitored characteristic is reflected power, once ignition occurs, the monitored characteristic generally decreases and the generator output power 313 is able to approach or remain at the setpoint 311 even when the variable protection limit is returned to the steady-state value 312. This starkly contrasts to the prior art, e.g., 3A, where the generator output power 303 was not able to approach or reach the setpoint 301 because the monitored characteristic 304 reached the protection limit 302 before the generator could produce enough power to ignite or reignite the plasma.

The ignition period 310 can be fixed or dependent upon an indication that the plasma has ignited or reignited (e.g., a drop in reflected power). Thus, by monitoring the first characteristic or by monitoring a second characteristic, distinct from the first characteristic, an indication can be observed as to when ignition or reignition occurs. For instance, dissipated power may be monitored as the first characteristic and compared to a protection limit in order to prevent damage to the balanced amplifier. At the same time, reflected power may be monitored as a second characteristic and a certain rate or amplitude reduction in reflected power can be indicative of ignition or reignition and thus used to determine an end to the ignition period. The end of the ignition period is also when a temporarily-raised protection limit can be reduced to the steady-state limit.

Protection limits other than reflected power can include dissipated power, DC power minus delivered RF power, DC current, "phantom power", forward power, combinations of forward and reflected power, and transistor junction temperature (e.g., BJT, FET, MOSFET, IGBT, etc). Although only a single protection limit is illustrated, in some embodiments, multiple protection limits can be implemented. DC power is a DC rail voltage of a power supply multiplied by a DC current provided from the power supply. Delivered RF power is the difference between forward RF power from the power supply and reflected RF power back into the power supply. Phantom power is a combination of forward and reflected power that is not equal to delivered power.

FIG. 4A illustrates a power versus time plot for a pulsed power delivery scheme having a traditional fixed protection limit 402. A characteristic of the plasma processing system (e.g., reflected power) can be monitored and is illustrated as 404. This monitored characteristic 404 can be seen to remain at or below the traditional fixed protection limit 402. If the plasma is not ignited, reflected power remains high and generator output power 403 never reaches the desired power setpoint 401.

FIG. 4B illustrates a power versus time plot for a pulsed power delivery scheme having a temporarily-increased protection limit 406 during multiple power pulses. Each pulse includes an ignition period 410 wherein the protection limit 406 is temporarily raised in order to allow the power 413 to rise to a higher level than is possible with a traditional fixed protection limit 402. At an end of each ignition period 410, the protection limit returns to a steady-state protection limit 412. The temporarily-increased protection limit 406 allows more power 413, for a short time, to be delivered, and thereby ignition can be achieved where it is not possible in the prior art (e.g., FIG. 4A). As a result, ignition is achieved at time 414, whereas ignition did not occur in the prior art example of 4A. In the case where the monitored characteristic is reflected power, once ignition occurs, the monitored characteristic 408 generally decreases and the generator output power 413 is able to approach or remain at the setpoint 411 even when the variable protection limit is returned to the steady state limit 412.

Although illustrated such that an ignition period 410 occurs at the start of each pulse, in other embodiments, there may only be an ignition period 410 at the start of the first pulse or there may only be an ignition period 410 at the start of pulses where the plasma was extinguished between pulses.

In some instances, one or more increased protection limits can be utilized for a first of numerous power pulses. In other instances, the increased protection limits can be used at the start of pulses other than the first pulse (e.g., at the start of a second or third pulse). In yet further instances, the increased protection limits can be used at the start of the first pulse as well as at the start of subsequent pulses. In yet further instances, the increased protection limits can be implemented at the start of pulses that begin providing power into an extinguished or yet-to-be-ignited plasma. In other words, the increased protection limits can be implemented for initial ignition of a plasma and any reignition requires at the start of subsequent pulses where plasma extinction occurs between pulses.

Integrated or Filtered Protection Limits

As described above, protection limits can be instantaneous values utilized for the ignition period. However, they can also be embodied in more flexible or adaptable limits, such as a limit based on an integrated or filtered value. This allows protection limits to be set based on values other than power (e.g., transistor junction temperature). For instance, rather than setting a reflected power protection limit to 600 W, the protection limit could be a temperature of a transistor junction in one of the balanced amplifiers. In particular, power dissipated in power amplifier devices (e.g., MOSFETs) can be estimated based on reflected power and other measured quantities such as load impedance. The estimated dissipated power as a function of time can then be used to estimate junction temperature as a function of time through filtering and/or integration taking into account the various thermal resistances and capacities of components in the system. The amplifier can then be pushed until the estimate of junction temperature is above an acceptable limit (e.g., a junction temperature protection limit) at which time output power is reduced to keep the estimate of device junction temperature at an acceptable level. In other words, rather than comparing an instantaneous value against an instantaneous limit, an estimate of a physically important quantity (such as e.g., device junction temperature) is compared against a limit for that quantity. The estimated quantity does not have to be an estimate of a physical quantity to be used in this way. For example, it is envisioned that reflected power may be filtered in this way and compared to a limit.

In some cases, the estimate can be calculated from a history of various quantities through integration and/or filtering. As an example, assuming power dissipated in a device is P and the device has a thermal resistance from junction to heatsink of R and a thermal capacity of C, the junction temperature above the heatsink temperature is the power P filtered by the filter $R/(1+sRC)$ in the Laplace domain.

Such a filter can be readily implemented in hardware, software, or a combination of the two to estimate the device junction temperature which can then be compared against a temperature limit. In some cases, integration can be performed via software-based systems and methods, while in others integration can be performed via filtering. Filtering can be performed in software, hardware, or a combination of the two. An exemplary method for controlling power to a plasma processing system using a filtered or integrated monitored characteristic to enable higher power delivery during an ignition period can be seen in FIG. 10.

Pulsed Power Delivery During Ignition

As noted above, the balanced amplifiers can handle greater power if that power is delivered over shorter periods of time. Extending this concept further, by pulsing power during the ignition period, instantaneous power during the ignition period can be raised higher than it can be if raised to a fixed value throughout the ignition period. Thus, the combination of increased protection limits during the ignition period and pulsed power enables even greater power delivery during ignition than increased protection limits alone.

FIG. 5A illustrates a power versus time plot for a continuous wave (CW) power delivery scheme having a traditional fixed protection limit 502. If the generator output power 503 is not enough to ignite the plasma, then the output power 503 typically does not attain the setpoint 501. To ignite the plasma, FIG. 5B shows that generator output power 513 can be raised above the steady-state protection limit 512 by both increasing the protection limit to a temporarily-increased protection limit 506 and pulsing the power 513 during an ignition period 510 as seen in FIG. 5B. The result of the higher protection limit 506 and the pulsing during the ignition period 510 is that power is able to ramp closer to the setpoint 511 than is possible in the prior art (e.g., see FIG. 5A). This increased power is enough to ignite the plasma at time $t_i$, 514. After ignition the generator can switch back to CW mode and the protection limit 506 can be lowed to the steady-state protection limit 512.

Such reduction of the protection limit can occur immediately after ignition (e.g., $t_1$), or may occur at some variable time after ignition as dictated by an indication that ignition has occurred (see e.g., FIG. 5B). In other words, the ignition period 510 can be a fixed period designed to be longer than a period of time required to ignite the plasma, or the ignition period 510 can be dependent on an indication that the plasma has been ignited or reignited (e.g., a rapid fall in reflected power).

Figure 6A:
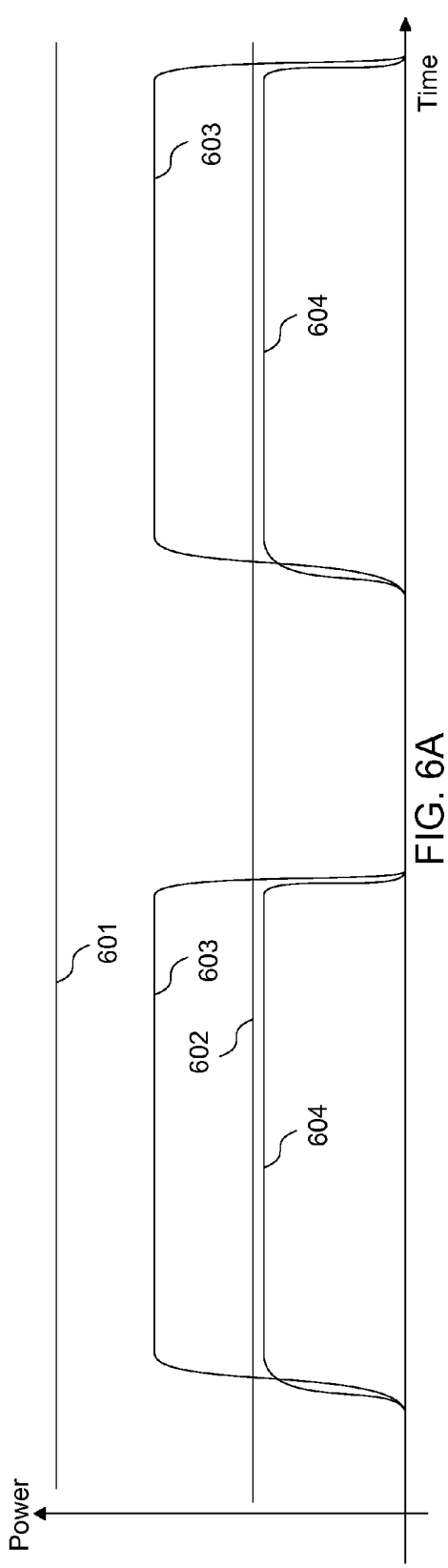
FIG. 6A illustrates a power versus time plot for a pulsed power delivery scheme having a traditional fixed protection limit.
Figure 6B:
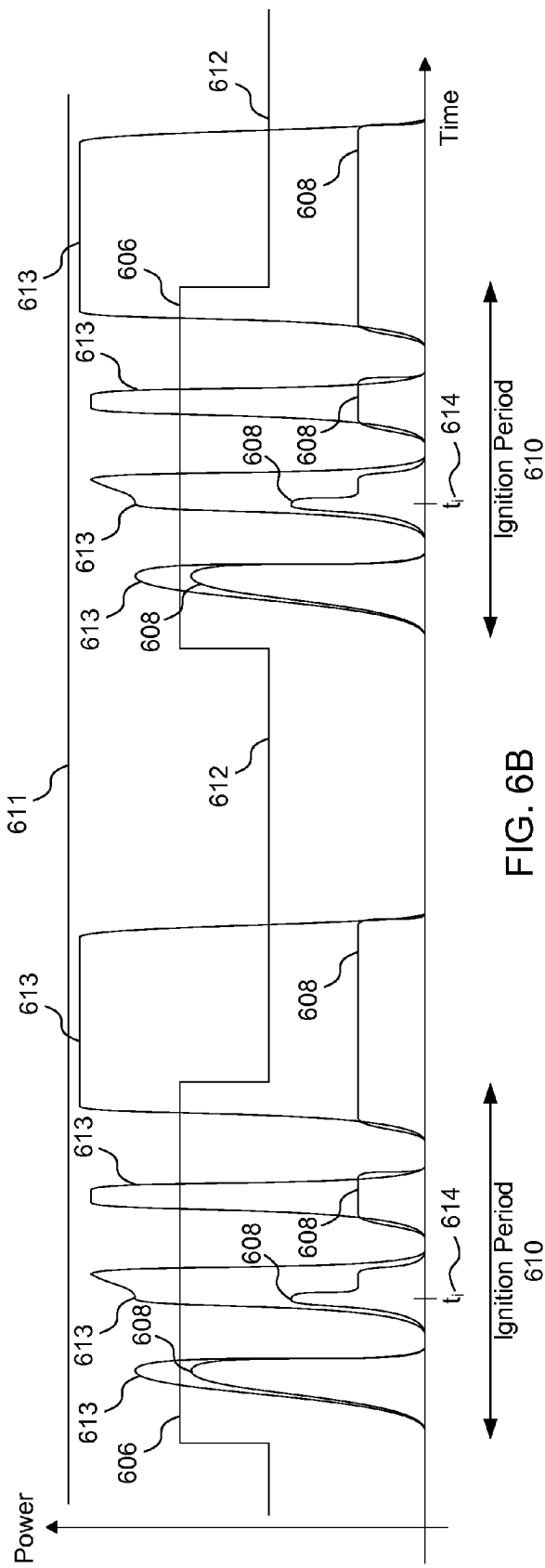
FIG. 6B illustrates a power versus time plot for a pulsed power delivery scheme having temporarily-increased protection limits, along with a high frequency pulsing of the power, during an ignition period, where power is further controlled via low-frequency pulsing.

FIG. 6A illustrates a power versus time plot for a pulsed power delivery scheme having a traditional steady-state protection limit 602. In this example, power 603 is pulsed two times in the illustrated plot. In contrast to the prior art, and in order to achieve plasma ignition, FIG. 6B illustrates a variable protection limit having a temporarily-raised protection limit 606 and a steady-state protection limit 612. This combined with pulsing of the power during the ignition period 610 enables the power 613 to approach the setpoint 611 to a greater extent than in the art and also enables a higher average power and thus a greater likelihood of plasma ignition. Power delivery can also be subject to a lower frequency pulsing similar to that seen in FIG. 6A. This scheme is applicable to, but not limited to, low frequency (e.g. pulse repetition rates below 100 Hz) pulsing where the generator is capable of pulsing at a higher (e.g. 10 kHz) than requested pulse rate.

Pulsed power delivery during the ignition period 510, 610 involves both providing increased protection limits 506, 606 (or ignition period protection limits) and pulsing the power 513, 613 to protect the generator from damage when operating with the higher protection limits. In the case where low frequency pulsing is also implemented (e.g., FIG. 6B), pulsing during the ignition period 610 has a higher frequency than the lower frequency pulsing used to sustain the plasma.

At the end of the ignition period 510, 610, the temporarily-increased protection limits 506, 606 can be reduced to steady-state protection limits 512, 612 and the high frequency pulsing can make way for steady-state operation (whether CW as in FIG. 5B or pulsed as in FIG. 6B). In some embodiments, high frequency pulsed power delivery during the ignition period 510, 610 can give way to steady-state operation as soon as plasma ignition is detected, while in others it continues for a fixed ignition period.

Both the increased protection limits 506, 606 and pulsed power during the ignition period 510, 610 can be implemented for continuous wave (CW) power delivery or pulsed power delivery. In the instance, of a CW power delivery scheme (e.g., FIG. 5B), an ignition period 510 is found at the start of the CW power delivery. In the case of a pulsed power delivery scheme (e.g., FIG. 6B), an ignition period 610 can be at the start of the first pulse, and/or may be at the start of each subsequent pulse. For instance, where pulsed power delivery results in the plasma becoming extinguished at the end of each pulse or between pulses, the herein described systems, methods, and apparatus can be implemented at an ignition period that starts as each pulse begins in order to reignite the plasma.

The ignition period protection limits described herein can be fixed or variable values. They can also include hysteretic thresholds. For instance, power can be turned on and allowed to rise until an upper protection limit is exceeded. Power can then be removed, but will not be turned back on until after the power drops below a lower protection limit that is lower than the upper protection limit.

Figure 8:
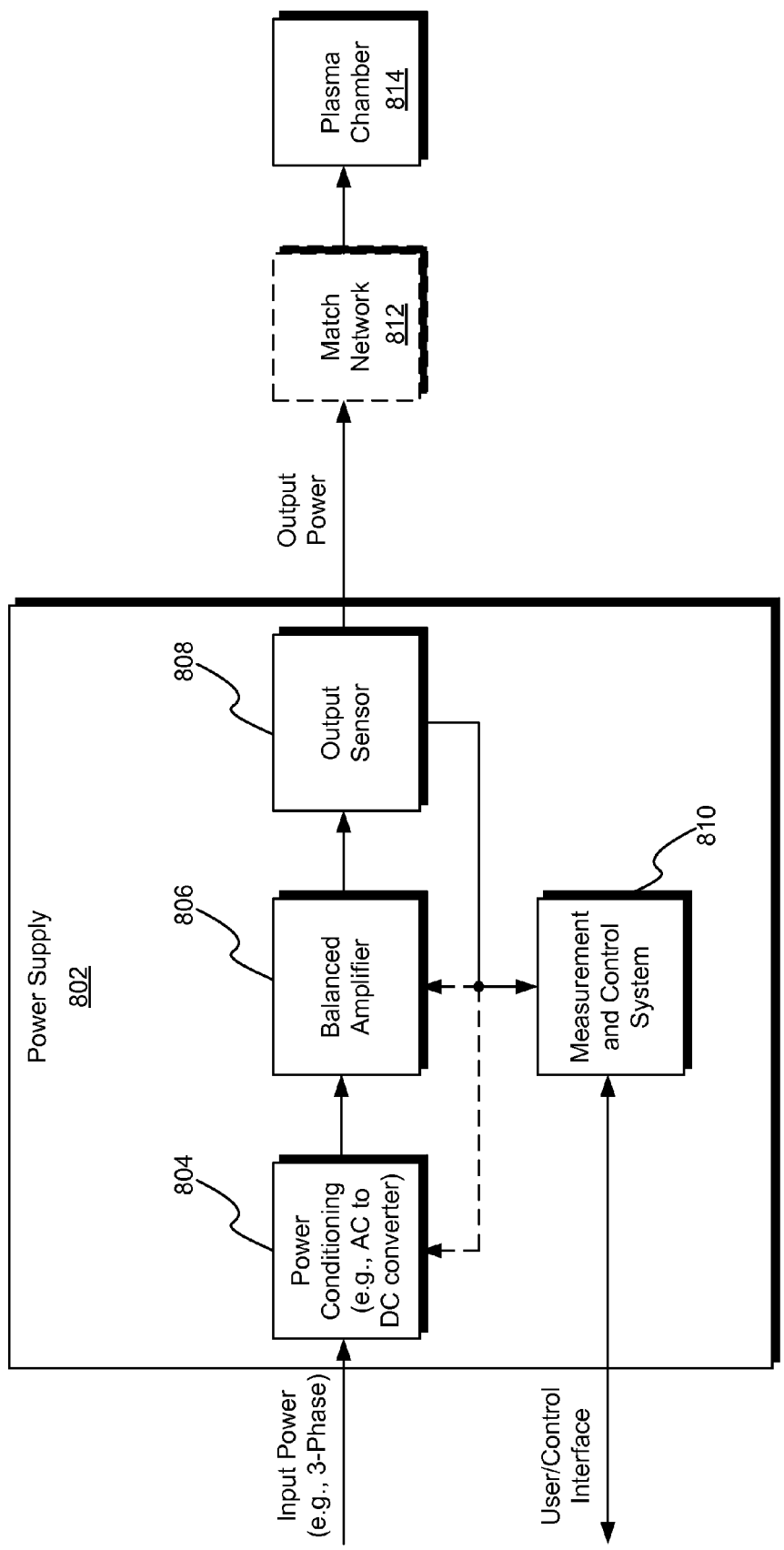
FIG. 8 shows a system for providing power to a plasma processing chamber.

FIG. 8 illustrates a system for providing power to a plasma processing chamber. A power supply 802 receives input power, such as 3-phase power, and generates an output power that can be provided to the plasma processing chamber 814 to ignite and sustain a plasma for various plasma processing tasks. An optional match network 812 can be arranged between the power supply 802 and the plasma processing chamber 814 to improve power delivery characteristics to the plasma processing chamber 814. The power supply 802 can include a power conditioning component 804 such as an AC to DC converter, a balanced amplifier 805, an output sensor 808, and a measurement and control system 810, among other components.

The balanced amplifier 806 can be coupled to an output of the power conditioning component and can take DC power generated by the power conditioning component 804 and amplify and modulate this power thus generating an RF output power of the power supply 802. The measurement and control system 810 can provide a control signal for the amplitude of the output power and also a low-level RF signal that dictates an RF frequency generated by the balanced amplifier 806. In alternative embodiments, an RF generator and a preamp can be used to provide the RF signal to the balanced amplifier 806 (see FIG. 12). One example of the balanced amplifier 806 is illustrated in FIG. 7.

The output sensor 808 can monitor and take measurements of the output power or a first characteristic of the output power. For instance, the output sensor 808 can monitor reflected power or dissipated power when combined with other information such as knowledge of amplifier dissipation as a function of power and load impedance or power delivered from the power conditioning component 804 to the balanced amplifier 806, to name two non-limiting examples. While the output sensor 808 is illustrated as being within the power supply 802, in other embodiments, the output sensor 808 can be external to the power supply 802. For instance, the output sensor 808 can be coupled to or arranged within the optional match network 812. In another embodiment, the output sensor 808 can be coupled between the output sensor 808 and the plasma processing chamber 814. In yet another embodiment, the output sensor 808 can be coupled between the optional match network 812 and the plasma processing chamber 814. In a further embodiment, the output sensor 808 can be coupled to or be arranged within the plasma processing chamber 814 and can monitor a first characteristic of the plasma. In other embodiments, there can be two or more output sensors 808 each monitoring a different characteristic. For instance, a first output sensor can monitor reflected power while a second output sensor can monitor dissipated power. In yet another embodiment, a single output sensor can monitor two different characteristics, such as reflected power and dissipated power.

The measurement and control system 810 can be in communication with the output sensor 808 and thereby receive the measurements of the characteristic of the plasma processing system (e.g., reflected power). The measurement and control system 810 can compare the monitored characteristic to a protection limit, such as the protection limits 306 and 312 in FIG. 3B, 406 and 412 in FIG. 4B, 506 and 512 in FIG. 5B, and 606 and 612 in FIG. 6B. The protection limit can be a variable protection limit as shown in FIGS. 3B, 4B, 5B, and 6B, where the variable protection limit can temporarily have a raised value and can then be reduced to a steady-state value for a remainder of processing or of a given power pulse. When a monitored characteristic that is filtered or integrated is used, a fixed protection limit can be used (although a variable protection limit is not excluded). A user can set or adjust the variable or fixed protection limit via a user/control interface such as a keyboard, mouse, touchscreen, some combination of these, or any other user/control interface known to those of skill in the art.

The measurement and control system 810 can also optionally be in communication with one or more of the power conditioning component 804 and the balanced amplifier 806. Communication with the power conditioning component 804 enables the measurement and control system 810 to adjust power delivery from the power conditioning component 804, for instance to try and reach a power setpoint and further to keep the monitored characteristic from reaching or exceeding the protection limit. Further, such communication enables the measurement and control system 810 to control a power waveform generated by the power conditioning component 804, such as the various pulsed power waveforms seen in FIGS. 4B, 5B, and 6B.

Communication with the balanced amplifier 806 enables the measurement and control system 810 to adjust power delivery from the balanced amplifier 806, for instance to try and reach a power setpoint and further to keep the monitored characteristic from reaching or exceeding the protection limit. Further, such communication enables the measurement and control system 810 to control a power waveform generated by the balanced amplifier 806, such as the various pulsed power waveforms seen in FIGS. 4B, 5B, and 6B.

The input power can be AC or DC, where the power conditioning component 804 converts this AC or DC input to DC power at the appropriate level for the balanced amplifier 806.

Figure 12:
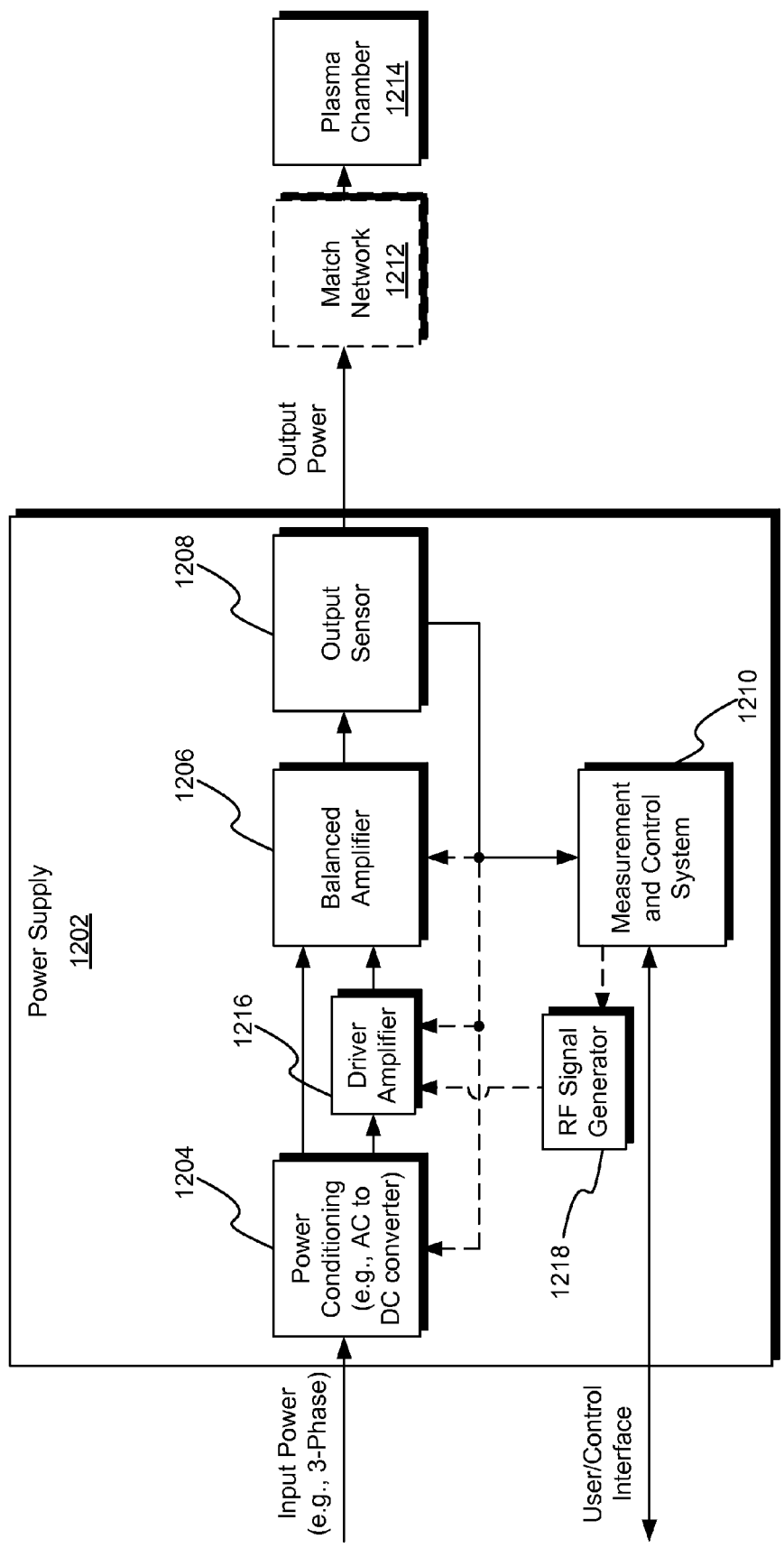
FIG. 12 shows another system for providing power to a plasma processing chamber.

FIG. 12 illustrates a system for providing power to a plasma processing chamber. A power supply 1202 receives input power, such as 3-phase power, and generates an output power that can be provided to the plasma processing chamber 1214 to ignite and sustain a plasma for various plasma processing tasks. An optional match network 1212 can be arranged between the power supply 1202 and the plasma processing chamber 1214 to improve power delivery characteristics to the plasma processing chamber 1214. The power supply 1202 can include a power conditioning component 1204 such as an AC to DC converter, a balanced amplifier 1205, an output sensor 1208, a measurement and control system 210, a driver amplifier 1216, and an RF signal generator 1218, among other components. The measurement and control system 1210 can instruct the RF signal generator 1218 to generate a given RF signal and/or to control a waveform shape thereof. In some instances, the measurement and control system 1210 may instruct the RF signal generator 1218 to produce a non-measurable or null signal such as one having zero current, voltage, and/or power amplitude.

The RF signal generator 1218 can produce a low-level RF signal and provide this to the driver amplifier 1216, where the driver amplifier 1216 can modulate DC power from the power conditioning component 1204 to generate an amplified version of the low-level RF signal. This amplified RF signal can be provided to the balanced amplifier 1206, and the balanced amplifier 1206 can then modulate DC power from the power conditioning component 1204 based on the RF signal from the driver amplifier 1216. At the same time, the measurement and control system 1210 can be in communication with one or more of the power conditioning component 1204, the balanced amplifier 1206, the driver amplifier 1216, and/or the RF signal generator 1218. Via communication with one or more of these components, the measurement and control system 1210 can control an amplitude and waveform of outputs from any one or more of these components. For instance, the gain of the balanced amplifier 1206 can be controlled or a pulse frequency of the power conditioning component 1204, to name two non-limiting examples.

Figure 9:
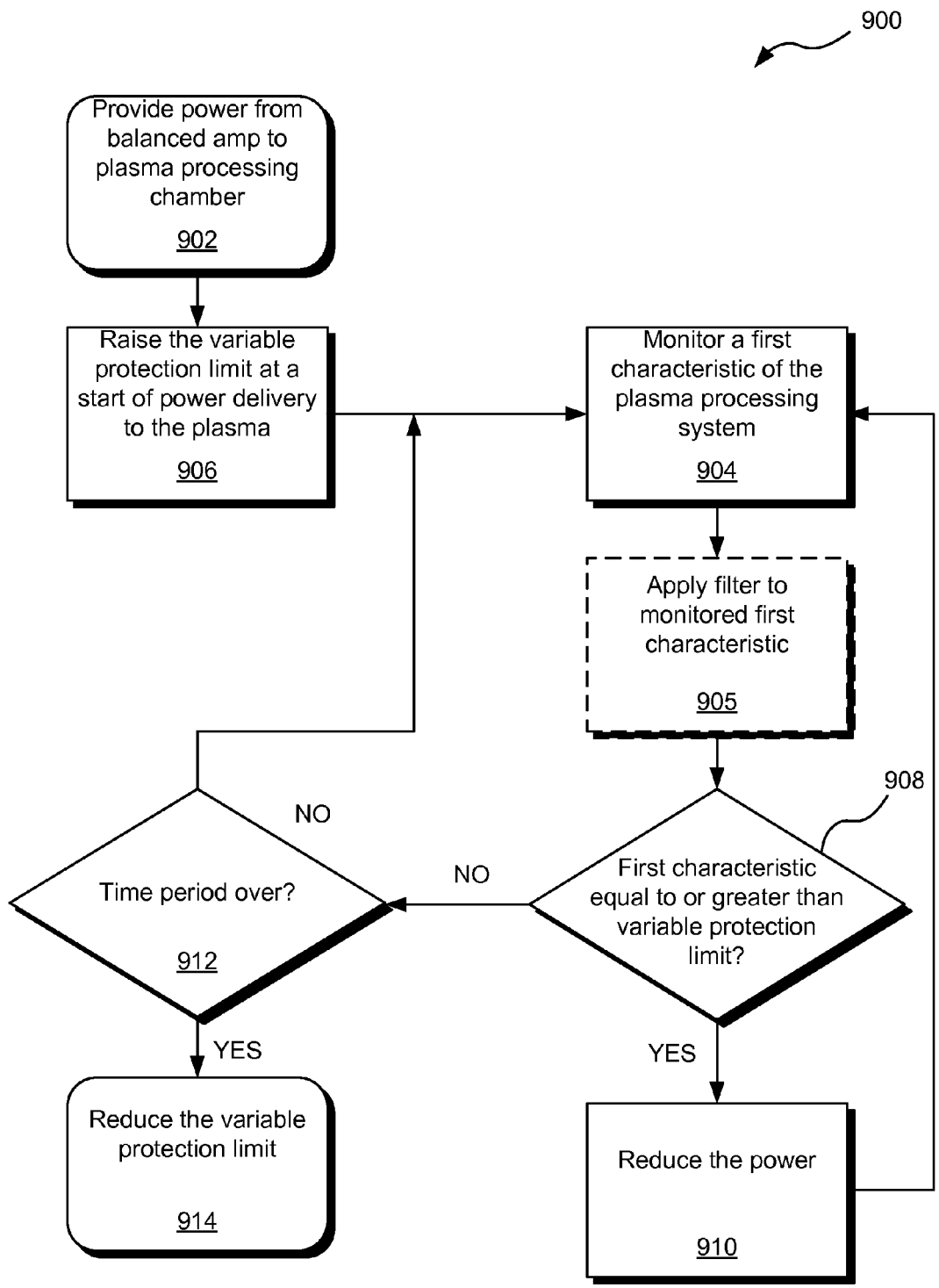
FIG. 9 shows a method for providing power to a plasma processing chamber.

FIG. 9 illustrates a method of providing power to a plasma processing chamber. The method 900 begins by providing power from a balanced amplifier to a plasma processing chamber (Block 902). A variable protection limit can be used, relative to a measured characteristic of the plasma processing system (e.g., reflected power measured at an output of a power supply), to protect circuitry in the amplifier. In the art, such protection limits are fixed and can prevent plasma ignition or reignition by preventing power from ramping to a desired setpoint when balanced amplifiers are used. In order to increase the likelihood of plasma ignition, a variable protection limit can be used, and includes a temporarily raised portion at a start of power delivery to the plasma (Block 906). Such a temporary increase in the variable protection limit can be seen in FIGS. 3B, 4B, 5B, and 6B, for example. The method 900 then monitors a first characteristic of the plasma processing system (Block 904) in order to identify if/when the first characteristic equals or exceeds the variable protection limit (Decision 908). When the first monitored characteristic does not equal or exceed the variable protection limit (Decision 908), the method 900 determines if a time period from the raising of the variable protection limit has ended (Decision 912). This period can be fixed or can end when an indication exists that the plasma has ignited or reignited. If the time period is not over, then the method 900 returns to the monitor operation (Block 904) and continues to loop through Block 904 and Decisions 908 and 912, until the time period is over (Decision 912) or the first characteristic is equal to or greater than the variable protection limit (Decision 908). If the variable protection limit is met or exceeded (Decision 908), then the method 900 reduces the power and again monitors and compares the first characteristic to the variable protection limit (Block 904 and Decision 908). Once the monitored characteristic falls below the variable protection limit, the method again determines if the time period is over (Decision 912). Once the time period ends, the variable protection limit can be reduced (Block 914). Monitoring and comparison to a steady-state protection limit (e.g., 312, 412, 512, 612) can then be carried out as is well known to those of skill in the art until the power is reduced (e.g., at an end of a processing run or in a case where pulsed power is being delivered).

In some embodiments, power can be delivered to the plasma in a pulsed mode. The power can be pulsed between zero and a power level, between one power level and another power level, or an arbitrary power waveform can be repeated at an operational pulse repetition rate. Given the arbitrary power waveform, each repeated waveform can have a duration of one operational period.

In another embodiment, a time between the raising (Block 906) and the reducing (Block 907) of the variable protection limit (e.g., an ignition period) is a pre-determined or fixed period of time. Further, there can be an ignition period at the start of each pulse, during each operational period, during each operational period for a set number of operational periods, or spanning multiple operational periods.

In yet another embodiment, a time between the raising (Block 906) and the reducing (Block 907) of the variable protection limit (e.g., an ignition period) is an ignition period and is a variable period of time. The reducing (Block 907) can initiate in response to an indication that the plasma has ignited or reignited. Further, there can be an ignition period at a start of each pulse, during each operation period, during each operational period for a set number of operational periods, or spanning multiple operational periods.

In yet another embodiment, a time between the raising (Block 906) and the reducing (Block 907) of the variable protection limit (e.g., an ignition period) is an ignition period and is a variable period of time. The power can be pulsed during the ignition period at an ignition pulse repetition rate with an ignition duty cycle. The ignition pulse repetition rate can exceed the operational pulse repetition rate and there can be an ignition period at the start of each pulse, during each operation period, during each operation period for a set number of operation periods, or spanning multiple operational periods.

Optionally, the first characteristic can be filtered and/or integrated (Block 905) such that transient, short term, or high frequency effects on the first characteristic are less likely to be considered when comparing to a protection limit. As such, after each iteration of the monitor a first characteristic of the plasma processing system (Block 904), a filter can be applied to the monitored first characteristic (Block 905). Comparison to the variable protection limit can then be made relative to a filtered first monitored characteristic (Decision 908). When the optional filter is applied, the method 900 otherwise operates as described above.

Figure 10:
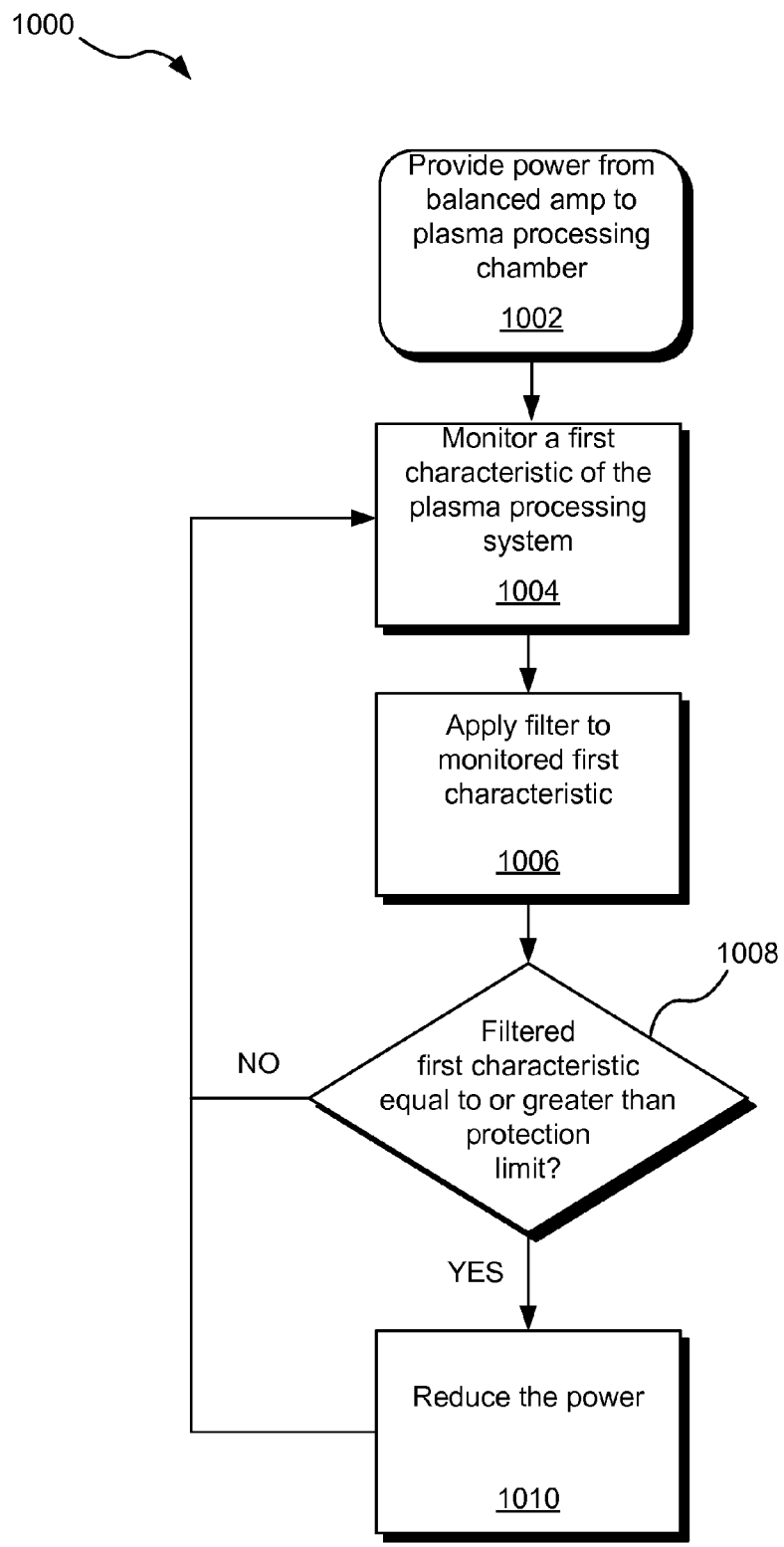
FIG. 10 shows another method for providing power to a plasma processing chamber.

Alternatively, a filter and/or integration can be used relative to a fixed protection limit. FIG. 10 illustrates a method for providing power to a plasma processing chamber where a filter is applied to a monitored characteristic in determining whether a monitored characteristic has met or exceeded a protection limit. The method 1000 includes providing power from a balanced amplifier to a plasma processing chamber (Block 1002). The method 1000 then monitors a first characteristic of the plasma processing system (e.g., reflected power) (Block 1004), and applies a filter (or integrates) the monitored first characteristic (Block 1006) to produce a filtered first characteristic. A comparison of the filtered first characteristic to a protection limit is then performed (Decision 1008). In some embodiments, since filtering or integration is being performed, a fixed protection limit can be used and yet increased power during an ignition period can still be achieved. For instance, where a low pass filter or integration is used, the monitored first characteristic will still tend to fall below a fixed or steady-state protection limit since the increased power during an ignition period is very short-lived.

Alternatively, a variable protection limit can be used and the variable protection limit can be temporarily raised during an ignition period (e.g., at a start of power delivery) as described earlier and shown in FIGS. 3B, 4B, 5B, and 6B. Regardless, the filtered first characteristic is compared to a protection limit (Decision 1008) and if the filtered first characteristic is equal to or greater than the protection limit, then the method can reduce the power from the balanced amplifier (Block 1010) such that the filtered/integrated first characteristic falls below the protection limit. If the filtered/integrated first characteristic is already below the protection limit, then the method 1000 loops back to the monitoring (Block 1004). Although illustrated as an infinite loop, the method 1000 only continues until a reduction in power is required other than that dictated by Decision 1008 (e.g., end of a processing run or an end of a power pulse). In some embodiments, the method 1000 may only be carried out until an end of an ignition period or until an indication that the plasma has ignited or reignited, and then comparisons to a steady-state protection limit can be implemented, or continued integration/filtering methods can be used. Either way, this method 1000 need not be implemented once the plasma is ignited or reignited.

While this disclosure has largely used examples where protection limits are reflected power protection limits, one of skill in the art will recognize that the systems, methods, and apparatus herein disclosed are equally applicable to other types of protection limits. For instance, transistor junction temperature and dissipated power are two other protection limits that can be used. This disclosure also focused on examples where only a single protection limit was used. However, one of skill in the art will also recognize that more than one protection limit can be used without departing from the scope of this disclosure.

Figure 11:
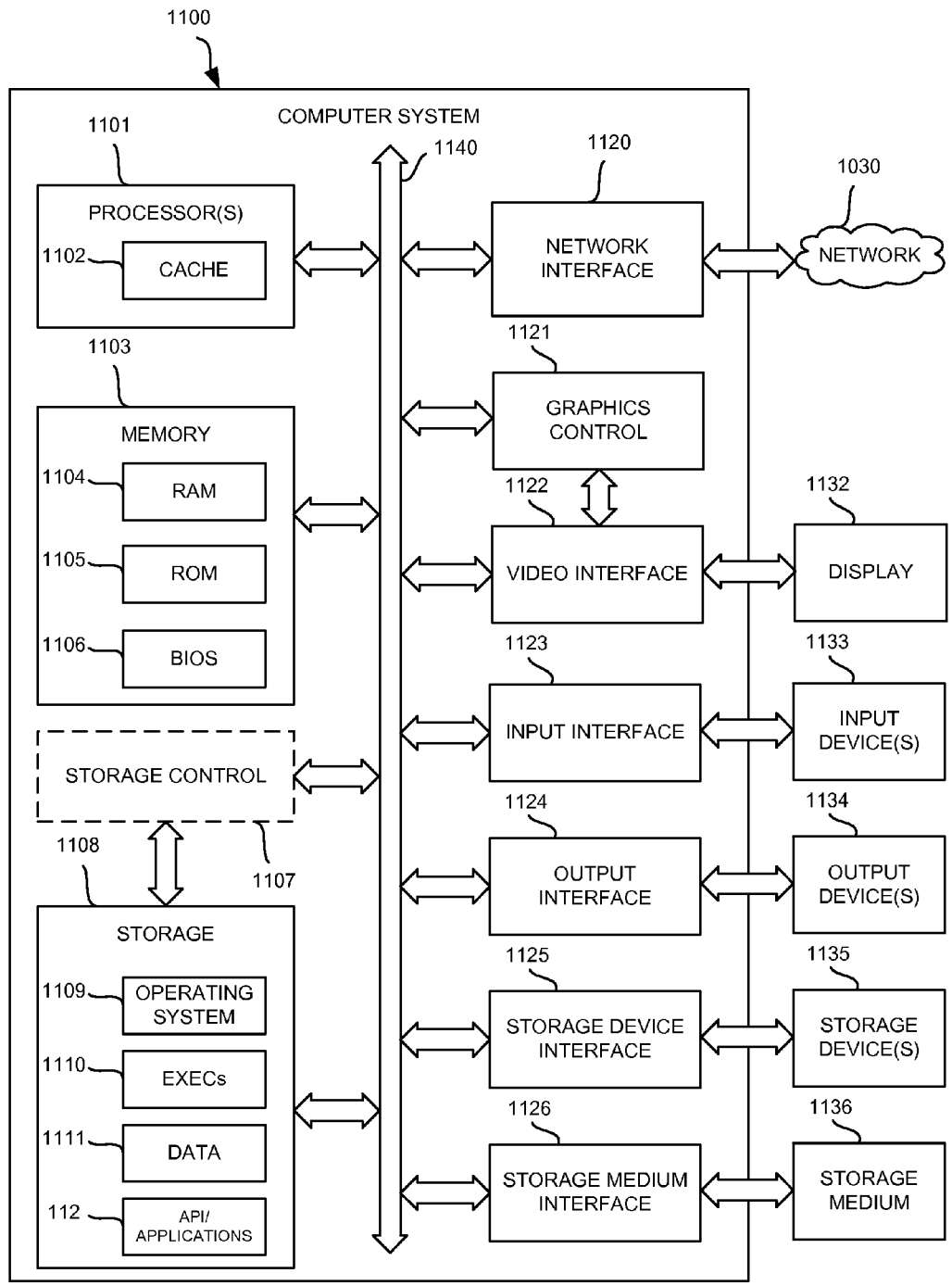
FIG. 11 shows a diagrammatic representation of one embodiment of a machine in the exemplary form of a computer system.

The systems and methods described herein can be implemented in a computer system in addition to the specific physical devices described herein. FIG. 11 shows a diagrammatic representation of one embodiment of a computer system 1100 within which a set of instructions can execute for causing a device to perform or execute any one or more of the aspects and/or methodologies of the present disclosure. A controller for a balanced amplifier is one example of the computer system 1100. The components in FIG. 11 are examples only and do not limit the scope of use or functionality of any hardware, software, firmware, embedded logic component, or a combination of two or more such components implementing particular embodiments of this disclosure. Some or all of the illustrated components can be part of the computer system 1100. For instance, the computer system 1100 can be a general purpose computer (e.g., a laptop computer) or an embedded logic device (e.g., an FPGA), to name just two non-limiting examples.

Computer system 1100 includes at least a processor 1101 such as a central processing unit (CPU) or an FPGA to name two non-limiting examples. A controller for controlling protection limits and pulse characteristics of a balanced amplifier is one implementation of the processor 1101. For instance, the processor 1101 can be implemented as the measurement and control system 810 or 1210. The computer system 1100 may also comprise a memory 1103 and a storage 1108, both communicating with each other, and with other components, via a bus 1140. For instance, the memory 1103 may store protection limits, pulse frequencies, and power setpoints for the power conditioning component 804 and/or the balanced amplifier 806. The bus 1140 may also link a display 1132, one or more input devices 1133 (which may, for example, include a keypad, a keyboard, a mouse, a stylus, etc.), one or more output devices 1134, one or more storage devices 1135, and various non-transitory, tangible computer-readable storage media 1136 with each other and with one or more of the processor 1101, the memory 1103, and the storage 1108. All of these elements may interface directly or via one or more interfaces or adaptors to the bus 1140. For instance, the various non-transitory, tangible computer-readable storage media 1136 can interface with the bus 1140 via storage medium interface 1126. Computer system 1100 may have any suitable physical form, including but not limited to one or more integrated circuits (ICs), printed circuit boards (PCBs), embedded control systems, power regulation subsystems, mobile handheld devices (such as mobile telephones or PDAs), laptop or notebook computers, distributed computer systems, computing grids, or servers.

Processor(s) 1101 (or central processing unit(s) (CPU(s))) optionally contains a cache memory unit 1102 for temporary local storage of instructions, data, or computer addresses. Processor(s) 1101 are configured to assist in execution of computer-readable instructions stored on at least one non-transitory, tangible computer-readable storage medium. Computer system 1100 may provide functionality as a result of the processor(s) 1101 executing software embodied in one or more non-transitory, tangible computer-readable storage media, such as memory 1103, storage 1108, storage devices 1135, and/or storage medium 1136 (e.g., read only memory (ROM)). For instance, methods to achieve the power versus time plots seen in FIGS. 3B, 4B, 5B, and 6B may be embodied in one or more non-transitory, tangible computer-readable storage media. The non-transitory, tangible computer-readable storage media may store software that implements particular embodiments, such as methods to achieve the power versus time plots illustrated in FIGS. 3B, 4B, 5B, and 6B and processor(s) 1101 may execute the software. Memory 1103 may read the software from one or more other non-transitory, tangible computer-readable media (such as mass storage device(s) 1135, 1136) or from one or more other sources through a suitable interface, such as network interface 1120. The software may cause processor(s) 1101 to carry out one or more processes or one or more steps of one or more processes described or illustrated herein. Carrying out such processes or steps may include defining data structures stored in memory 1103 and modifying the data structures as directed by the software. In some embodiments, an FPGA can store instructions for carrying out functionality (e.g., methods to achieve the power versus time plots illustrated in FIGS. 3B, 4B, 5B, and 6B) as described in this disclosure. In other embodiments, firmware includes instructions for carrying out functionality as described in this disclosure (e.g., methods to achieve the power versus time plots illustrated in FIGS. 3B, 4B, 5B, and 6B).

The memory 1103 may include various components (e.g., machine readable media) including, but not limited to, a random access memory component (e.g., RAM 1104) (e.g., a static RAM "SRAM", a dynamic RAM "DRAM, etc.), a read-only component (e.g., ROM 1105), and any combinations thereof. ROM 1105 may act to communicate data and instructions unidirectionally to processor(s) 1101, and RAM 1104 may act to communicate data and instructions bidirectionally with processor(s) 1101. ROM 1105 and RAM 1104 may include any suitable non-transitory, tangible computer-readable media described below. In some instances, ROM 1105 and RAM 1104 include non-transitory, tangible computer-readable media for carrying out methods to achieve the power versus time plots illustrated in FIGS. 3B, 4B, 5B, and 6B. In one example, a basic input/output system 1106 (BIOS), including basic routines that help to transfer information between elements within computer system 1100, such as during start-up, may be stored in the memory 1103.

Fixed storage 1108 is connected bidirectionally to processor(s) 1101, optionally through storage control unit 1107. Fixed storage 1108 provides additional data storage capacity and may also include any suitable tangible computer-readable media described herein. Storage 1108 may be used to store operating system 1109, EXECs 1110 (executables), data 1111, API applications 1112 (application programs), and the like. For instance, the storage 1108 could be implemented for storage of instructions for executing methods to achieve the power versus time plots illustrated in FIGS. 3B, 4B, 5B, and 6B. Often, although not always, storage 1108 is a secondary storage medium (such as a hard disk) that is slower than primary storage (e.g., memory 1103). Storage 1108 can also include an optical disk drive, a solid-state memory device (e.g., flash-based systems), or a combination of any of the above. Information in storage 1108 may, in appropriate cases, be incorporated as virtual memory in memory 1103.

In one example, storage device(s) 1135 may be removably interfaced with computer system 1100 (e.g., via an external port connector (not shown)) via a storage device interface 1125. Particularly, storage device(s) 1135 and an associated machine-readable medium may provide nonvolatile and/or volatile storage of machine-readable instructions, data structures, program modules, and/or other data for the computer system 1100. In one example, software may reside, completely or partially, within a machine-readable medium on storage device(s) 1135. In another example, software may reside, completely or partially, within processor(s) 1101.

Bus 1140 connects a wide variety of subsystems. Herein, reference to a bus may encompass one or more digital signal lines serving a common function, where appropriate. Bus 1140 may be any of several types of bus structures including, but not limited to, a memory bus, a memory controller, a peripheral bus, a local bus, and any combinations thereof, using any of a variety of bus architectures. As an example and not by way of limitation, such architectures include an Industry Standard Architecture (ISA) bus, an Enhanced ISA (EISA) bus, a Micro Channel Architecture (MCA) bus, a Video Electronics Standards Association local bus (VLB), a Peripheral Component Interconnect (PCI) bus, a PCI-Express (PCI-X) bus, an Accelerated Graphics Port (AGP) bus, HyperTransport (HTX) bus, serial advanced technology attachment (SATA) bus, and any combinations thereof.

Computer system 1100 may also include an input device 1133. In one example, a user of computer system 1100 may enter commands and/or other information into computer system 1100 via input device(s) 1133. Examples of an input device(s) 1133 include, but are not limited to, an alpha-numeric input device (e.g., a keyboard), a pointing device (e.g., a mouse or touchpad), a touchpad, a joystick, a gamepad, an audio input device (e.g., a microphone, a voice response system, etc.), an optical scanner, a video or still image capture device (e.g., a camera), and any combinations thereof. Input device(s) 1133 may be interfaced to bus 1140 via any of a variety of input interfaces 1123 (e.g., input interface 1123) including, but not limited to, serial, parallel, game port, USB, FIREWIRE, THUNDERBOLT, or any combination of the above.

In particular embodiments, when computer system 1100 is connected to network 1130, computer system 1100 may communicate with other devices, such as mobile devices and enterprise systems, connected to network 1130. Communications to and from computer system 1100 may be sent through network interface 1120. For example, network interface 1120 may receive incoming communications (such as requests or responses from other devices) in the form of one or more packets (such as Internet Protocol (IP) packets) from network 1130, and computer system 1100 may store the incoming communications in memory 1103 for processing. Computer system 1100 may similarly store outgoing communications (such as requests or responses to other devices) in the form of one or more packets in memory 1103 and communicated to network 1130 from network interface 1120. Processor(s) 1101 may access these communication packets stored in memory 1103 for processing.

Examples of the network interface 1120 include, but are not limited to, a network interface card, a modem, and any combination thereof. Examples of a network 1130 or network segment 1130 include, but are not limited to, a wide area network (WAN) (e.g., the Internet, an enterprise network), a local area network (LAN) (e.g., a network associated with an office, a building, a campus or other relatively small geographic space), a telephone network, a direct connection between two computing devices, and any combinations thereof. A network, such as network 1130, may employ a wired and/or a wireless mode of communication. In general, any network topology may be used.

Information and data can be displayed through a display 1132. Examples of a display 1132 include, but are not limited to, a liquid crystal display (LCD), an organic liquid crystal display (OLED), a cathode ray tube (CRT), a plasma display, and any combinations thereof. The display 1132 can interface to the processor(s) 1101, memory 1103, and fixed storage 1108, as well as other devices, such as input device(s) 1133, via the bus 1140. The display 1132 is linked to the bus 1140 via a video interface 1122, and transport of data between the display 1132 and the bus 1140 can be controlled via the graphics control 1121.

In addition to a display 1132, computer system 1100 may include one or more other peripheral output devices 1134 including, but not limited to, an audio speaker, a printer, and any combinations thereof. Such peripheral output devices may be connected to the bus 1140 via an output interface 1124. Examples of an output interface 1124 include, but are not limited to, a serial port, a parallel connection, a USB port, a FIREWIRE port, a THUNDERBOLT port, and any combinations thereof.

In addition or as an alternative, computer system 1100 may provide functionality as a result of logic hardwired or otherwise embodied in a circuit, which may operate in place of or together with software to execute one or more processes or one or more steps of one or more processes described or illustrated herein. Reference to software in this disclosure may encompass logic, and reference to logic may encompass software. Moreover, reference to a non-transitory, tangible computer-readable medium may encompass a circuit (such as an IC) storing software for execution, a circuit embodying logic for execution, or both, where appropriate. The present disclosure encompasses any suitable combination of hardware, software, or both.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA), a microcontroller, or other programmable logic device, discrete gate or transistor logic, discrete hardware components, or any combination thereof designed to perform the functions described herein. A general purpose processor may be a microprocessor, but in the alternative, the processor may be any conventional processor, controller, or microcontroller. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein (e.g., methods to achieve the power versus time plots illustrated in FIGS. 3B, 4B, 5B, and 6B) may be embodied directly in hardware, in a software module executed by a processor, a software module implemented as digital logic devices, or in a combination of these. A software module may reside in RAM memory, flash memory, ROM memory, EPROM memory, EEPROM memory, registers, hard disk, a removable disk, a CD-ROM, or any other form of non-transitory, tangible computer-readable storage medium known in the art. An exemplary non-transitory, tangible computer-readable storage medium is coupled to the processor such that the processor can read information from, and write information to, the non-transitory, tangible computer-readable storage medium. In the alternative, the non-transitory, tangible computer-readable storage medium may be integral to the processor. The processor and the non-transitory, tangible computer-readable storage medium may reside in an ASIC. The ASIC may reside in a user terminal. In the alternative, the processor and the non-transitory, tangible computer-readable storage medium may reside as discrete components in a user terminal. In some embodiments, a software module may be implemented as digital logic components such as those in an FPGA once programmed with the software module.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed:

1. A method of providing power to a plasma processing chamber, the method comprising:
   providing power from a balanced amplifier to a plasma processing chamber;
   monitoring a first characteristic of the plasma processing system;
   comparing the first characteristic to a variable protection limit;
   reducing the power if the first monitored characteristic exceeds the variable protection limit;
   raising the variable protection limit at a start of power delivery to the plasma; and
   reducing the variable protection limit.

2. The method of claim 1, wherein the variable protection limit is reduced to a steady-state protection limit after a fixed period of time.

3. The method of claim 1, wherein the variable protection limit is reduced to a steady-state protection limit upon indication that a plasma in the plasma processing chamber has ignited or reignited as a result of application of the output power to the plasma processing chamber.

4. The method of claim 3, wherein the indication comes from a second characteristic of the plasma processing system.

5. The method of claim 4, wherein the second characteristic is reflected power.

6. The method of claim 1, wherein the first characteristic is reflected power.

7. The method of claim 1, wherein the power is pulsed while the variable protection limit is raised.

8. The method of claim 1, further comprising raising the power until the first characteristic equals or exceeds the variable protection limit.

9. The method of claim 1, wherein the reducing is performed by a component selected from a group consisting of the following: the balanced amplifier; a driver amplifier providing power to the balanced amplifier; an RF signal generator providing power to the balanced amplifier; and a power conditioning component providing power to the balanced amplifier.

10. The method of claim 1, further comprising:
    applying a filter to the first characteristic to produce a filtered first characteristic;
    comparing the filtered first characteristic to the variable protection limit; and
    reducing the power if the filtered first characteristic reaches or exceeds the variable protection limit.

11. The method of claim 1, wherein a time between the raising and the reducing of the variable protection limit is an ignition period and is a pre-determined period of time and there is an ignition period at the start of each pulse or there is an ignition period during each operational period or there is an ignition period during each operational period for a set number of operational periods or there is one ignition period spanning multiple operational periods.

12. The method of claim 1, wherein a time between the raising and the reducing of the variable protection limit is an ignition period and is a variable period of time where the reducing occurs in response to a determination that the plasma has ignited or reignited and there is an ignition period at the start of each pulse or there is an ignition period during each operational period or there is an ignition period during each operational period for a set number of operational periods or there is one ignition period spanning multiple operational periods.

13. The method of claim 1, wherein a time between the raising and the reducing of the variable protection limit is an ignition period, and wherein the power is pulsed during the ignition period at an ignition pulse repetition rate with an ignition duty cycle where the ignition pulse repetition rate exceeds the operational pulse repetition rate and there is an ignition period at the start of each pulse or there is an ignition period during each operational period or there is an ignition period during each operational period for a set number of operational periods or there is one ignition period spanning multiple operational periods.

14. A power supply for providing power to a plasma processing chamber comprising:
    a power conditioning component receiving input power to the power supply;
    a balanced amplifier coupled to the power conditioning component and providing an output power to an output of the power supply;
    an output sensor taking measurements of a first characteristic of the output power;
    a measurement and control system in communication with the output sensor, and comprising:
        a comparison module comparing the measurements of the first characteristic of the output power to a variable protection limit, where the variable protection limit is temporarily raised during a plasma ignition period; and
        a power output control module reducing the output power if the first monitored characteristic exceeds the variable protection limit.

15. The power supply of claim 14, wherein the variable protection limit is reduced to a steady-state protection limit after a fixed period of time.

16. The power supply of claim 14, wherein the variable protection limit is reduced to a steady-state protection limit upon indication that a plasma in the plasma processing chamber has ignited or reignited as a result of application of the output power to the plasma processing chamber.

17. The power supply of claim 14, wherein the measurement and control system instructs a component to perform the reducing, wherein the component is selected from the group consisting of: the balanced amplifier; a power conditioning component providing power to the balanced amplifier; a driver amplifier providing power to the balanced amplifier; and an RF signal generator providing an RF signal to the balanced amplifier.

18. A non-transitory, tangible computer readable storage medium, encoded with processor readable instructions to perform a method for providing power to a plasma processing chamber via a plasma processing system, the method comprising:
    providing power from a balanced amplifier to a plasma processing chamber;
    monitoring a first characteristic of the plasma processing system;
    comparing the first characteristic to a variable protection limit;
    reducing the power if the first monitored characteristic exceeds the variable protection limit;
    raising the variable protection limit at a start of power delivery to the plasma;
    reducing the variable protection limit after some time period.

19. The non-transitory, tangible computer readable storage medium, encoded with processor readable instructions of claim 18, wherein the variable protection limit is reduced to a steady-state protection limit after a fixed period of time.

20. The non-transitory, tangible computer readable storage medium, encoded with processor readable instructions of claim 18, wherein the variable protection limit is reduced to a steady-state protection limit upon indication that a plasma in the plasma processing chamber has ignited or reignited as a result of application of the output power to the plasma processing chamber.

* * * * *